July 29, 1952 G. M. DALY 2,604,791

RADIO TUNING DRIVE AND BAND SELECTOR MECHANISM

Filed April 19, 1950

Inventor
George M. Daly
By
H. O. Newton
Attorney

Patented July 29, 1952

2,604,791

UNITED STATES PATENT OFFICE 2,604,791

RADIO TUNING DRIVE AND BAND SELECTOR MECHANISM

George M. Daly, West Collingswood, N. J., assignor to Radio Corporation of America, a corporation of Delaware Application April 19, 1950, Serial No. 156,866

4 Claims. (Cl. 74—10.41)

This invention relates to radio tuning drive and band selector mechanisms of the general type ordinarily used to adjust variable tuning elements in radio receivers such as capacitors and inductances. In particular, this invention relates to a tuning drive mechanism which has a main tuning control and band selector means and a vernier tuning control means.

Radio receiving and, in particular, television receiving equipment is generally difficult to tune precisely and repeatedly to a particular station or channel. This difficulty in tuning is due to the fact that a large frequency range may be covered by the tuning system. In a continuously variable tuner which covers the entire television spectrum a small displacement of the tuning control means may therefore result in a large frequency change. In this case, a small angle of rotation of a tuning control knob may cause the tuner to pass over a frequency band including a large number of stations or channels.

For the above reasons, a vernier tuning adjustment is desirable in most types of radio or television receiving equipment. However, vernier tuning within preselected frequency channels is generally made possible only by means of expensive mechanisms. A primary object of this invention, therefore, is to provide a simplified and improved band selection and variable tuning mechanism for radio equipment which has an associated means for providing a vernier tuning adjustment.

In tuning means of the type described, the tuning ratio of the main tuning control has to be made large enough so that the entire tunable frequency spectrum may be covered with a relatively small movement of the control means. This results in the need for a vernier tuning mechanism which will not interfere with rapid shifts of the main tuning control when widely separated frequency channels are selected.

Such vernier or slow motion drive means must also be made so that there is no backlash. Manufacturing tolerances must therefore be close to prevent backlash in mechanisms which are constructed and adapted to turn in two directions. As a result, such tuning means are generally relatively costly to manufacture and may necessarily include added devices for preventing backlash.

In general, a vernier tuning control means must be provided to afford a repeated accurate adjustment in a television type tuning system. The vernier control should further be smooth in operation and designed for a low production cost.

It is desirable therefore to provide a drive mechanism having all parts constructed of either simple sheet metal stampings or cylindrical parts. It is also desirable to use a minimum number of parts both to keep the cost of the tuning mechanism and the cost of assembling the mechanism at a minimum. In some of the known prior art tuners the reduction of parts has been made at the cost of sacrificing functional advantages.

It is therefore a primary object of the invention, to provide a functionally superior band selecting and vernier drive mechanism which uses a minimum of parts and yet involves no critical adjustments.

It is a further object of the invention, to provide an improved radio tuning drive and band selector mechanism which obviates the aforementioned and other inadequacies of the prior known tuning control systems, and which may be manufactured and assembled at low cost.

Another object of the invention is to provide a radio tuning mechanism which provides a simple tuning movement over a large frequency spectrum and which also provides a vernier tuning movement to any narrow frequency channel within the large spectrum.

Other objects of the invention will become apparent from the detailed description contained in the specification when considered in conjunction with the accompanying drawings.

A tuning control system in accordance with the invention, includes a band selector tuning mechanism for rapidly tuning a radio receiver through a large portion of the radio frequency spectrum to a specific frequency channel. A simplified means is provided in the mechanism for precisely preselecting a desired one of the frequency channels. A further means is provided for slow motion tuning within any of the relatively narrow preselected channels. As explained above, such a mechanism is generally useful in selectively tuning television type or other radio receivers. The present television broadcast receivers are tunable to several assigned frequency channels within a relatively large broadcast frequency spectrum. The present improved tuning mechanism then may be used to precisely select the respective frequency channels and to tune to the stations assigned within the channels.

For a further understanding of the invention, in the accompanying drawing, there are shown several complete examples of tuning means constructed in accordance with the invention, and these may be considered with the description hereinafter given with respect thereto. The invention is further defined in the appended claims.

Figure 1:
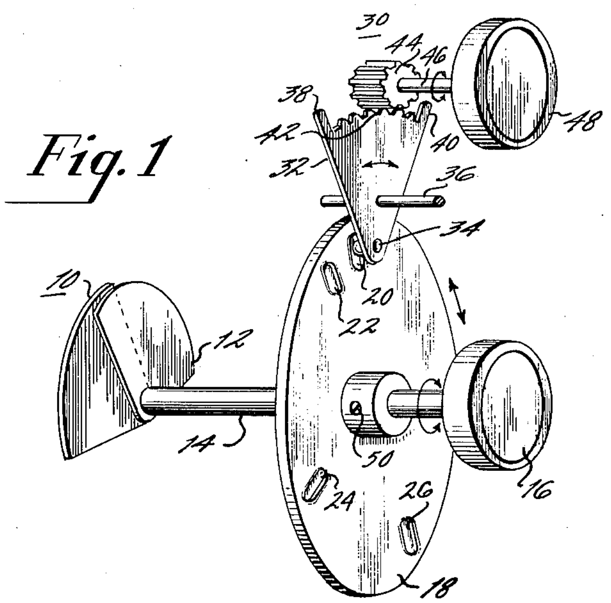
Figure 1 is a perspective view of radio tuning drive means constructed in accordance with this invention.

Referring now particularly to the accompanying drawing, like numerals indicate like parts throughout the several views. In particular with reference to Figures 1 and 2, there is shown a variable capacitor 10 or other similar movable tuning control means for an associated radio circuit (not shown). In this embodiment, the variable tuner shall be referred to as a capacitor for purpose of simplicity. The movable plate 12 of the variable capacitor 10 is rotated by means of a main tuning control shaft 14. To this shaft is connected a main tuning control knob 16 to effect rotation thereof. A signal or frequency band locating surface or detent disc 18 is also firmly affixed to the control shaft 14, by means of a set screw 50 or like fastener, to rotate therewith. Conversely, rotation of the disc will cause rotation of the shaft 14 and the attached capacitor rotor 12. It is therefore seen that a vernier mechanism may be used for rotating the disc 18. Such a device will be discussed more fully hereinafter.

A dial assembly of any known type (not shown), may also be connected to the control shaft 14 at the extreme front end near the knob 16, if desired. This dial may be of any suitable type to give an indication of the tuning adjustment of the apparatus with which the tuning drive system is used. As such indicating means are old and well known and do not form part of the tuning systems embodying the invention, it has been omitted for the sake of simplifying the drawing and permitting clearer illustration of the tuning system per se.

For purposes of rotating the disc as above described, as well as for purposes of arresting movement of the disc at different frequency channels, well defined elongated detents or band locating depressions 20, 22, 24 and 26 are impressed in the detent disc 18. The band locating depressions are located in the disc 18 at points corresponding to preselected bands within the broad frequency spectrum through which the capacitor 10 may be tuned.

A detent stop member 34 may then be located near the detent disc 18 to arrest movement of the disc successively at the band locating depressions 20, 22, 24 and 26 upon rotation of the tuning control shaft 14. Spring bias or resilient action of some type may be used to force the stop member 34 into the respective detents 20, 22, 24 and 26 and arrest motion of the disc. When the stop member is engaged with one of the depressions, a greater torque must be applied to the knob 16 to continue the rotation of detent disc 18 and the capacitor rotor 12 by overcoming the resilient action. In this shown embodiment the disc 18 is of a thin resilient material such as sheet bronze, and is therefore made resilient at its outer circumference. In this manner the required spring bias is provided by a resulting spring or snap action of the thin disc material itself.

It is to be recognized that the tuner is not restricted to use in a television type receiver since the detents 20, 22, 24 and 26 may for example correspond to assigned broadcast bands in the radio sound frequency spectrums. Band switching is effected by rotation of the main tuning control knob 16, and the vernier tuner mechanism 30 therefore could be used to select stations within the selected band. It is further to be recognized that variable inductance or any other variable frequency determining means may be used in place of the single variable capacitor 10 which is used merely by way of example to indicate any variable tuning means having a movable or rotatable control element.

Vernier tuning is manually effected by rotation of a knob 48 of the vernier tuning mechanism 30. This in turn causes the detent stop 34 to pivot through a small arc thus changing the position of the capacitor rotor 12. The preferred vernier tuning mechanism, as shown, comprises a pivoted gear sector 32 having a detent stop 34 located at its smaller end. The sector is pivoted about a pivot axis 36 located at an intermediate point on the sector. The sector arc section or periphery 42 has gear teeth located therein and stop lugs 38, 40 are provided at the edges of the gear sector arc. This arc, if circular, should have its axis of rotation located at the pivot point 36. A pinion gear 44 will then mesh properly with the sector geared arc 42. The pinion 44 is affixed to a vernier control shaft 46 and is rotated by means of the vernier tuning knob 48 to effect movement of the sector 32 about its pivot axis 36.

Rotation of the knob 48 will therefore effect a slight, but smooth, movement of the variable tuning member 10. This movement is attained by means of the detent stop member 34. The moving detent stop 34 rides in the depression 20 of the detent disc 18, and therefore forces the disc 18 into a small angle of rotation about its shaft 14.

The band locating depressions 20, 22, 24 and 26 mating with the detent stop 34 are elongated to allow engagement of the depressions and the stop throughout a complete swing of the gear sector 32 through its pivot range as defined by the gear sector stops 38 and 40. The depressions are distinctly defined in order to mate with the stop 34 without any tendency toward backlash.

Riveted or otherwise fastened to the vernier pivot lever 32 is the detent stop 34. The pivot lever 32 itself may be stamped or punched from a metal sheet of the proper shape. It is to be noted that the geared periphery 42 is actually a circular arc since the pivot axis 36 is located at the center of the arc. This therefore means that the vernier lever or gear sector 32 is a sector of a circle larger than that defined by the gear periphery arc 42. If the lever were made into a sector of a smaller circle, the gear surface would have to be made having an arc with its center at the pivot axis 36 to provide a complete meshing of the pinion 44 with the gear sector as it is moved about its pivot axis 36.

The minor lever arm of the vernier lever 32 from the pivot axis 36 to the detent stop 34 is designed to give a proper vernier tuning range as determined by the ratio of the minor lever arm to the major lever arm from the sector periphery 42 to the pivot axis 36. This ratio may also be chosen small enough that the torque required to dislodge the stop 34 from engagement with the detents upon rotation of the detent disc 18 will not tend to change the chosen vernier tuning position.

In accordance with the described mechanism therefore, the disc 18 is affixed to the shaft 14 by means of the screw 50 and may be rotated by means of the control knob 16. The detent stop member 34 is adapted to engage the detents 20, 22 located in the disc 18 and arrest the movement of the disc at points corresponding thereto. These points in turn correspond to preselected radio channels within the frequency spectrum of a variable tuner 10. Vernier adjustment of the radio tuning member 10 within the preselected bands is then accomplished by means of the vernier actuating mechanism 30. As this mechanism pivots the vernier lever or gear sector 32 about its axis, the disc 18 is moved by the stop 34. This in turn causes the capacitor rotor plate 12 to be rotated to a different point within the preselected band.

Figure 2:
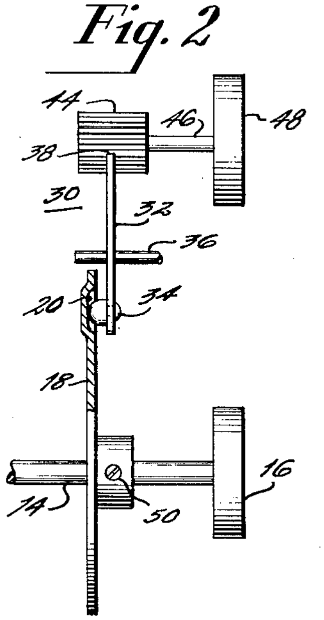
Figure 2 is a side view, partially in section, of the mechanism shown in Figure 1 in accordance with the invention.
Figure 3:
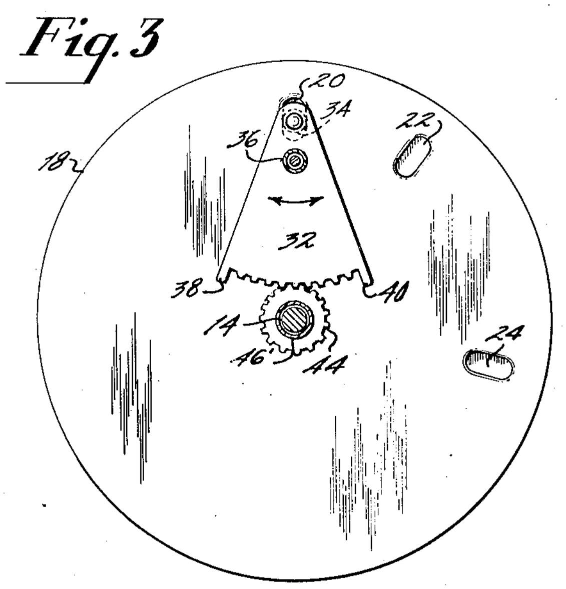
Figures 3 and 4 are elevation and side views of a modified tuning mechanism of the type shown in Figure 1, in accordance with the invention, Figure 3 being taken along lines 3—3 of Figure 4 and Figure 4 being partly in section.
Figure 4:
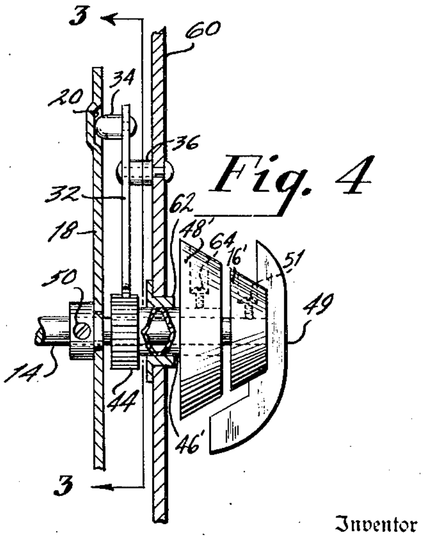

Figures 3 and 4 show a radio tuning and band selector mechanism similar to that shown in Figures 1 and 2 but having the respective control shafts 14 and 46′ of the band tuning and vernier tuning mechanism concentrically mounted. The vernier control shaft 46′ is in the shown embodiment as a hollow tubing surrounding and bushing the main tuning control shaft 14. The vernier shaft 46′ is extended through a panel 60 representing the front of a radio cabinet or the like by means of a bushing 62. The shaft 46′ is then mounted so that it may easily be rotated by means of the vernier tuning knob 48′, which is affixed to the shaft with a screw 64 or some other like fastening device. Rotation of the vernier knob 48′ will therefore turn the pinion gear 44 which is affixed to the vernier shaft 46′. The gear 44 is then also concentrically mounted about the main tuning control shaft 14. Rotation of the pinion 44 will move the gear sector 32 about its pivot axis 36 in a manner heretofore described. The detent stop 34 engaging the band locating depressions 20, 22, 24 in the detent surface 18 will move the detent disc 18 through a small angle of rotation.

The detent surface 18, as that in Figure 1, is preferably made of a flexible sheet metal such as sheet bronze to provide a resilient action tending to firmly retain the stop 34 within the selected detent 20. Other resilient means such as hereinafter described may however be used with the mechanism to cause the detent stop 34 to snap successively into registry with the band locating depressions 20, 22, 24 upon rotation of the main tuning control knob 16′.

The main tuning control knob 16′ is provided with a combined lever-pointer member 49. This modification of the lever affords a longer lever arm and therefore a larger torque on the main tuning control shaft 14 so that the detent stop 34 may be forced from its resilient engagement with the band locating depressions 20, 22 and 24. The pointer end 51 of the lever 49 may be used in conjunction with a dial arrangement (not shown) to indicate the respective channels to which the mechanism is tuned.

Figure 5:
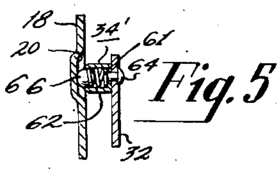
Figure 5 is a detailed side view of a particular detent stop used in conjunction with the tuning drive means of the invention.

In some cases it may be desirable to construct the disc 18 of a nonresilient material. A modified detent stop 34′ as shown in Figure 5 may be used in this case. There is provided a hollow cylindrical casing 62 riveted or otherwise attached to the gear sector 32 by means of a fastener 64 which comprises the detent stop body. The ends of the casing may be peened or otherwise constricted to a diameter slightly less than the major diameter of a ball member 66 retained within the cylindrical body 62 of the stop 34′. A spring bias member 61 is then located within the hollow casing 62 for resiliently forcing the ball 66 toward the open end of the cylindrical casing.

From the foregoing discussion of the modified stop member, it is seen that rotation of main control tuning knob 16 or 16′ would tend to force the extruding portion of the ball member 66 back into the cylindrical casing 62. The disc 18 could then rotate freely and with little friction until the next successive depression is moved into registry therewith. At that time the ball will snap into place to arrest motion of the disc 18, unless a torque is applied to the tuning control knob 16 great enough to again force the ball member 66 into its casing 62.

With the described detent tuning drive and band selector mechanism, tuning may be accomplished rapidly and accurately to narrow frequency channels within a large frequency spectrum. This tuning is effected by means of the main tuning control and band selector mechanism. The tuning mechanism is further constructed of a minimum of parts, yet is functionally superior in operation to many complicated mechanisms of the prior art. Precise and accurate tuning within the respective channels is also possible by means of the associated vernier tuning control means. The tuning arrangement therefore is particularly adapted for use in television receivers or the like as an improved tuning drive and band selector mechanism.

From the foregoing description it is seen that the invention is clearly disclosed, both as to construction and manner of operation. It will therefore readily appear to those skilled in the art that there may be modifications made to the shown embodiments which will not necessarily depart from the spirit and scope of the invention as defined in the appended claims.

What is claimed is:

1. A tuning drive and band selector mechanism comprising in combination, a tuning control member adapted to be connected with and movable to effect tuning of radio apparatus and the like within a preselected frequency spectrum, a main tuning control shaft for variably moving and adjusting said member, a detent disc firmly affixed to said tuning control shaft for rotary movement therewith, said disc having a plurality of sharply defined frequency band locating detents at points corresponding to preselected bands within said frequency spectrum, a detent stop member adapted to engage said detents to arrest movement of said disc and said shaft at said points, a pivoted gear sector having said detent stop member affixed at the smaller end for pivoted movement therewith, and a pinion gear meshing with said gear sector for pivotally moving said gear sector, thereby causing a small angle of rotation of said main tuning control shaft and a corresponding vernier adjustment of the tuning control member for tuning adjustment thereof within said preselected bands.

2. A mechanism as defined in claim 1 wherein said pinion gear is mounted on a vernier control shaft concentric with said main tuning control shaft.

3. A mechanism as defined in claim 1 wherein said detent stop member comprises a hollow cylindrical casing closed at one end, a ball member retained with a portion extending from the open end of said casing and a spring bias member for resiliently forcing said ball toward said open end.

4. A tuning drive mechanism for radio receivers and the like comprising in combination, movable tuning control means, a main tuning drive shaft for moving said tuning control means, a member movable with said main tuning drive shaft, a series of detents carried by said member, each adapted to represent a predetermined broadcast frequency channel, means for selecting said detents successively, vernier control means comprising a pivoted gear sector, said means for selecting said detents being mounted on the smaller end of said sector, and vernier adjustment means including a pinion gear meshing with said gear sector.

GEORGE M. DALY.

REFERENCES CITED

The following references are of record in the file of this patent:

UNITED STATES PATENTS

| Number | Name | Date |
|---|---|---|
| 2,511,602 | Sperber | June 13, 1950 |